United States Patent
Yudanov (10) Patent No.: US 10,529,677 B2
(45) Date of Patent: Jan. 7, 2020

(54) METHOD AND APPARATUS FOR POWER DELIVERY TO A DIE STACK VIA A HEAT SPREADER

(71) Applicant: Advanced Micro Devices, Inc., Santa Clara, CA (US)

(72) Inventor: Dmitri Yudanov, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/965,425

(22) Filed: Apr. 27, 2018

(65) Prior Publication Data
US 2019/0333876 A1    Oct. 31, 2019

(51) Int. Cl.
| | | |
|---|---|---|
| H01L 27/08 | (2006.01) | |
| H01L 23/64 | (2006.01) | |
| H01L 23/528 | (2006.01) | |
| H01L 25/065 | (2006.01) | |
| H01L 23/00 | (2006.01) | |
| H01L 23/31 | (2006.01) | |
| H01L 23/34 | (2006.01) | |

(52) U.S. Cl.
CPC ........ *H01L 23/645* (2013.01); *H01L 23/3157* (2013.01); *H01L 23/34* (2013.01); *H01L 23/5286* (2013.01); *H01L 24/09* (2013.01); *H01L 24/17* (2013.01); *H01L 24/49* (2013.01); *H01L 24/73* (2013.01); *H01L 25/0657* (2013.01)

(58) Field of Classification Search
CPC ............... H01L 23/645; H01L 23/3157; H01L 23/5286; H01L 23/34; H01L 25/0657
See application file for complete search history.

(56) References Cited

U.S. PATENT DOCUMENTS

| | | |
|---|---|---|
| 7,198,980 B2 | 4/2007 | Jiang et al. |
| 2010/0052111 A1 | 3/2010 | Urakawa |
| 2013/0256913 A1 | 10/2013 | Black et al. |
| 2014/0225248 A1* | 8/2014 | Henderson ............. H01L 21/50 257/712 |
| 2014/0321062 A1* | 10/2014 | Ng ..................... H01L 23/3675 361/719 |
| 2015/0168972 A1 | 6/2015 | Mathiyalagan et al. |
| 2017/0263518 A1 | 9/2017 | Yu et al. |

OTHER PUBLICATIONS

Julie Strietelmeier; *Oral-B Triumph with SmartGuide ProfessionalCare 9910 Electric Toothbrush*; https://the-gadgeteer.com/2007/08/09/oral_b_triumph_9910/; Aug. 9, 2007; pp. 1-29.
Wikipedia; File: *Lamp powered by induction 1910.jpg*; https://en.wikipedia.org/wiki/File:Lamp_powered_by_induction_1910.jpg; May 4, 2015; pp. 1-4.

(Continued)

*Primary Examiner* — Phuc T Dang
(74) *Attorney, Agent, or Firm* — Timothy M. Honeycutt (57) ABSTRACT

Various chip stack power delivery circuits are disclosed. In one aspect, an apparatus is provided that includes a stack of semiconductor chips that has an uppermost semiconductor chip and a lowermost semiconductor chip. A heat spreader is positioned on the uppermost semiconductor chip. A power transfer circuit is configured to transfer electric power from the heat spreader to the uppermost semiconductor chip.

16 Claims, 8 Drawing Sheets

(56) References Cited

OTHER PUBLICATIONS

Elizabeth Dougherty; Massachusetts Institute of Technology; *Spectrum Charging Ahead: A New Method for Wireless Power Transfer*; http://spectrum.mit.edu/spring-2015/charging-ahead-a-new-method-for-wireless-power-transfer/; Spring 2015; pp. 1-4.
Wikipedia; *Wireless power transfer*; https://en.wikipedia.org/w/index.php?title=Wireless_power_transfer&oldid=836616269; Apr. 15, 2018; pp. 1-41.

* cited by examiner

METHOD AND APPARATUS FOR POWER DELIVERY TO A DIE STACK VIA A HEAT SPREADER

This invention was made with Government support under the PathForward program with Lawrence Livermore National Security, LLC (Prime Contract No. DE-AC52-07NA27344, Subcontract No. B620717 awarded by The United States Department of Energy). The Government has certain rights in this invention.

BACKGROUND OF THE INVENTION

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Stacked dice arrangements involve placing or stacking one or more semiconductor chips on a base semiconductor chip. In some conventional variants, the base semiconductor chip is a high heat dissipating device, such as a microprocessor. The stacked chips are sometimes memory devices. So-called 2.5D stacking involves placing two chips side-by-side on an interposer, while 3D stacking involves stacking one or more chips on an underlying chip. The stack of chips is placed on an underlying board.

BRIEF DESCRIPTION OF THE DRAWINGS

The foregoing and other advantages of the invention will become apparent upon reading the following detailed description and upon reference to the drawings in which.

DETAILED DESCRIPTION

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is delivering electrical power to the chips in the stack.

A typical package substrate for a stacked dice arrangement includes many scores of interconnects, such as pins, lands or solder balls. In conventional package and stack designs, some of these interconnects are set aside for power and ground and some are used for signals. For many conventional designs, a majority of the available interconnects must be used for power/ground. This presents a potential limit on the amount of signals (i.e., the bandwidth) that can be propagated to and from the chips in the stack.

Some conventional techniques to address bandwidth include introducing high speed serial protocols and increasing the number of interconnects by reducing the pitch between individual interconnects. These techniques may or may not work in a given situation.

In accordance with one aspect of the present invention, an apparatus is provided that includes a substrate, at least one semiconductor chip stacked on the substrate, a heat spreader stacked on the at least one semiconductor chip, and means for transferring electrical power from the heat spreader to the at least one semiconductor chip.

In accordance with another aspect of the present invention, an apparatus is provided that includes a stack of semiconductor chips that has an uppermost semiconductor chip and a lowermost semiconductor chip. A heat spreader is positioned on the uppermost semiconductor chip. A power transfer circuit is configured to transfer electric power from the heat spreader to the uppermost semiconductor chip.

In accordance with another aspect of the present invention, a method manufacturing is provided that includes fabricating a stack of semiconductor chips that has an uppermost semiconductor chip and a lowermost semiconductor chip. A heat spreader is positioned on the uppermost semiconductor chip. A power transfer circuit is connected to the heat spreader and the stack. The power transfer circuit is configured to transfer electric power from the heat spreader to the stack.

Figure 1:
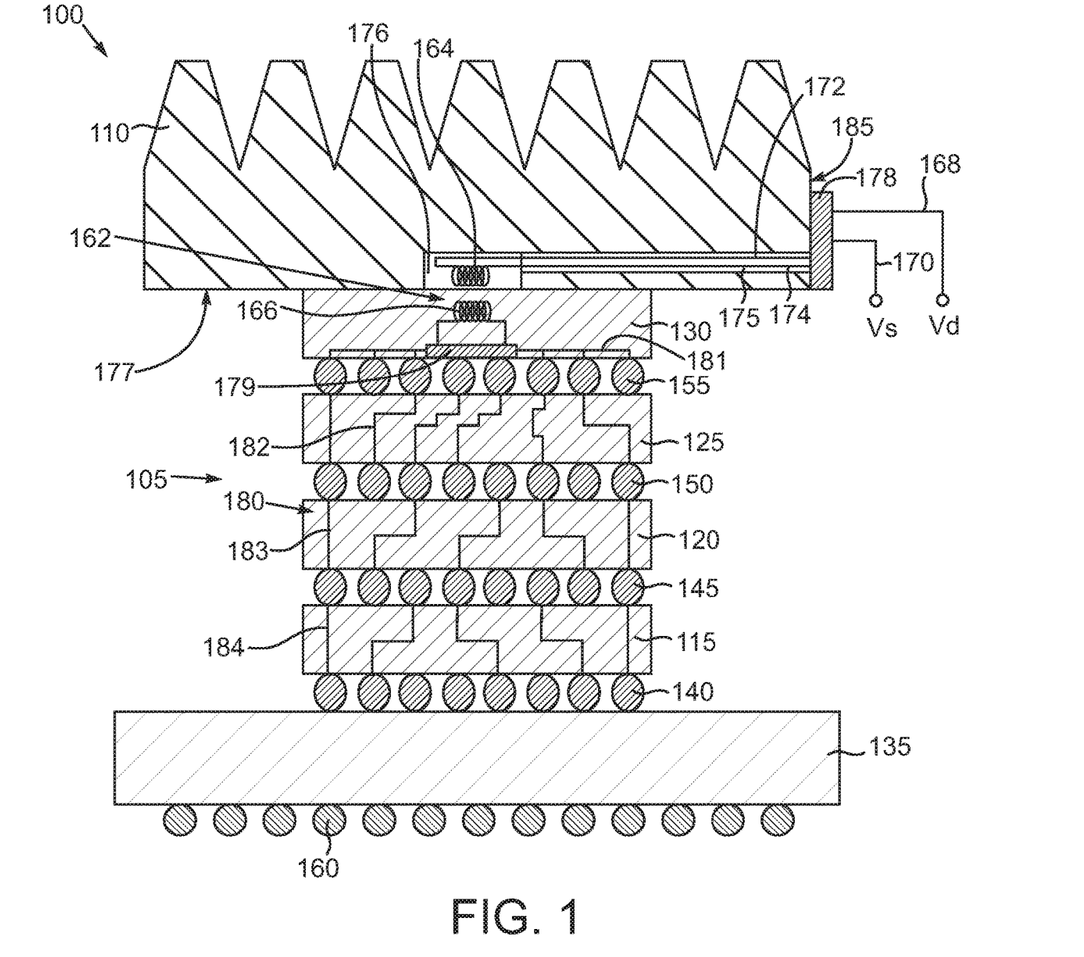
FIG. 1 is a sectional view of an exemplary arrangement of a semiconductor chip device with a chip stack.

In the drawings described below, reference numerals are generally repeated where identical elements appear in more than one figure. Turning now to the drawings, and in particular to FIG. 1, therein is shown a sectional view of an exemplary arrangement of a semiconductor chip device 100 that is operable to provide electrical power to one or more semiconductor chips of a chip stack 105 by way of a heat spreader 110. In this illustrative arrangement, the chip stack 105 includes semiconductor chips 115, 120, 125 and 130 with the semiconductor chip 115 constituting the lower most chip in this chip stack 105 and the semiconductor chip 130 sitting in the top most position of the chip stack 105. It should be understood that the number of chips in the stack 105 can be one or more. The semiconductor chips 115, 120, 125 and 130 can be any of a variety of integrated circuits. A non-exhaustive list of examples includes microprocessors, graphics processing units, accelerated processing units that combines aspects of both, memory devices, an application integrated specific circuit or other. The chip stack 105 can be mounted on another substrate 135, which in this illustrative arrangement is another semiconductor chip, but could also be a circuit board. The substrate 135 can be of the chip types just described or even an interposer. The semiconductor chip 115 can be electrically connected to the semiconductor chip 135 by way of plural interconnects 140. The semiconductor chips 115 and 125 can be electrically connected by way of an additional plurality of interconnects 145 and plural interconnects 150 and 155 can electrically interconnect the chips 120 and 125 and 125 and 130, respectively. The interconnects 140, 145, 150 and 155 can be solder bumps, solder micro-bumps, conductive pillars or other interconnects. Well-known lead free solders, such as Sn—Ag, Sn—Ag—Cu or others can be used. Conductive pillars of copper, gold, aluminum, combinations of these or the like can be used with or without solder caps. To interface electrically with another component such as a circuit board or other device, the substrate 135 can include plural interconnects 160. The interconnects 160 can be conductive pins, lands, pillars, solder balls, solder bumps or other types of interconnect structures of the same types of materials just discussed.

The heat spreader 110 can be any of a large myriad of configurations and can include fins or virtually any other heat spreader element. The heat spreader 110, and any disclosed alternatives, can be composed of well-known materials, such as, copper, aluminum, or others. To deliver electrical power to the chip stack 105 by way of the heat spreader 110, the heat spreader 110 and the semiconductor chip 130 include an inductive power transfer circuit 162, which includes an inductor coil 164 attached to the heat spreader 110 and another inductor coil 166 that is positioned in the semiconductor chip 130. The inductor coils 164 and 166 can be of a great variety of configurations such as flat plains, spiral coils, solenoid coils or other types of inductor elements. The inductor coil 164 is connected to an external power 168 and a ground 170 (also labeled Vd and Vs) by way of respective electrical leads 172 and 174. The leads 172 and 174 can be routed through a wire bore 175 in the heat spreader 110. The inductor coil 166 can be positioned in a pocket 176 in the lower surface 177 of the heat spreader 110. The wire bore 175 and the pocket 176 can have virtually any shape. Intermediate between the power input 168, the ground input 170, and the leads 172 and 174 is a power supply circuit 178 that includes an oscillator that is operable to receive a DC voltage input, convert that DC voltage to an AC voltage, and deliver the AC voltage to the inductor 164 to generate a magnetic field.

The inductor coil 166 is connected to a voltage regulator 179 in the semiconductor chip 130. The voltage regulator 179 includes a voltage regulator and control logic to take the voltage induced in the coil 166 and convert it back to a regulated DC voltage for ultimate supply to the chips 115, 120, 125 and 130. To disperse the regulated voltage from the voltage regulator 179, the chips 115, 120, 125 and 130 include a power delivery network 180, which consists of plural electrical pathways 181 in the semiconductor chip 130 that are connected to the voltage regulator 179, plural electrical pathways 182 in the semiconductor chip 125, plural electrical pathways 183 in the semiconductor chip 120 and plural electrical pathways 184 in the semiconductor chip 115. These electrical pathways 181, 182, 183 and 184, which can consist of through chip vias, traces, individual metallization layer vias or other types of conductors, combine with the interconnects 140, 145, 150 and 155 to convey regulated DC power from the voltage regulator 179 to the chips 115, 120, 125 and 130. In this way, many of the interconnects 160 can be devoted to the conveyance of signals since power and ground do not have to be delivered en masse up through the stack 105 from the substrate 135, for example. It is envisioned that one or more of the interconnects 160 can be connected to external ground so that ground pathways are provided for the chips 115, 120, 125 and 130 of the stack 105. Optionally, some or all of the stack 105 can be floating on a permanent or selective basis. In other arrangements, each of the chips 115, 120 and 125 can resemble the chip 130 and thus include its own inductor coil 166 and voltage regulator 179 such that electric power can be delivered inductively to all the chips 115, 120, 125 and 130 by way of the inductor coil 164.

Figure 2:
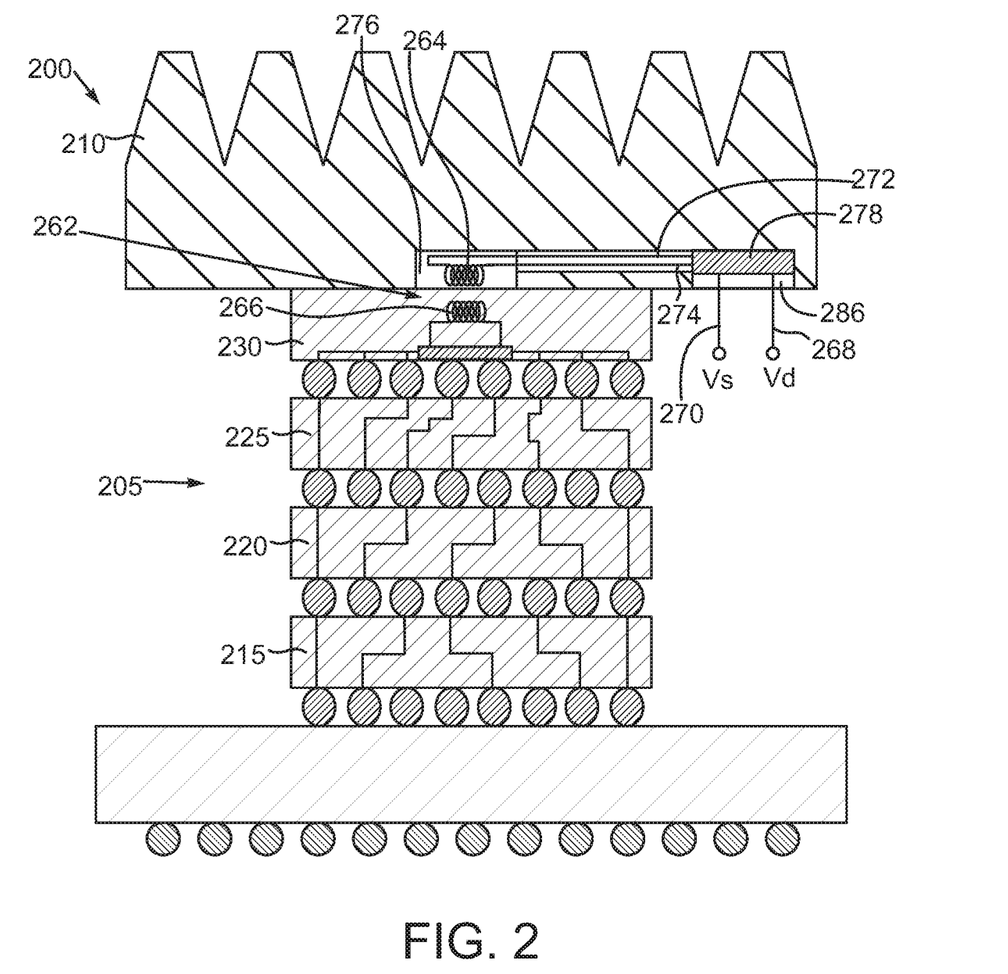
FIG. 2 is a sectional view of an alternate exemplary semiconductor chip device with a chip stack.

Note that in this illustrative arrangement, the power supply logic 178 is mounted externally to the heat spreader 110 on a side surface 185 thereof. This mounting can be by way of adhesives, brackets, screws or virtually any other mounting scheme. However, it should be understood that the power supply logic 178 can be positioned in other fashions relative to a heat spreader. An alternate exemplary semiconductor chip device 200 is illustrated in section in FIG. 2. A chip stack 205 is positioned beneath and provided power by a heat spreader 210. The chip stack 205 can be configured like the chip stack 105 shown in FIG. 1, and thus includes chips 215, 220, 225 and 230. An inductive power transfer circuit 262 including inductor coils 264 and 266, like the inductive power transfer circuit 162 discussed above, is used to provide power to the chips 215, 220, 225 and 230. Power input 268 and ground 270 connect through the heat spreader 210. Leads 272 and 274 connect to the inductor coil 264. The heat spreader 210 includes a pocket 276 to accommodate the inductor coil 264 that delivers power inductively to the inductor coil 266 in the semiconductor chip 230 as described above. However, the power supply logic 278, which can be like the power supply logic 178, can be positioned in an additional pocket 286 in the heat spreader 210. In other respects, the semiconductor chip device 200 can be configured as described above in conjunction with the arrangement depicted in FIG. 1. FIGS. 1 and 2 are intended to show that the power supply logic 178 and 278 can be positioned in a great variety of different positions relative to the heat spreaders 110 or 210.

Figure 3:
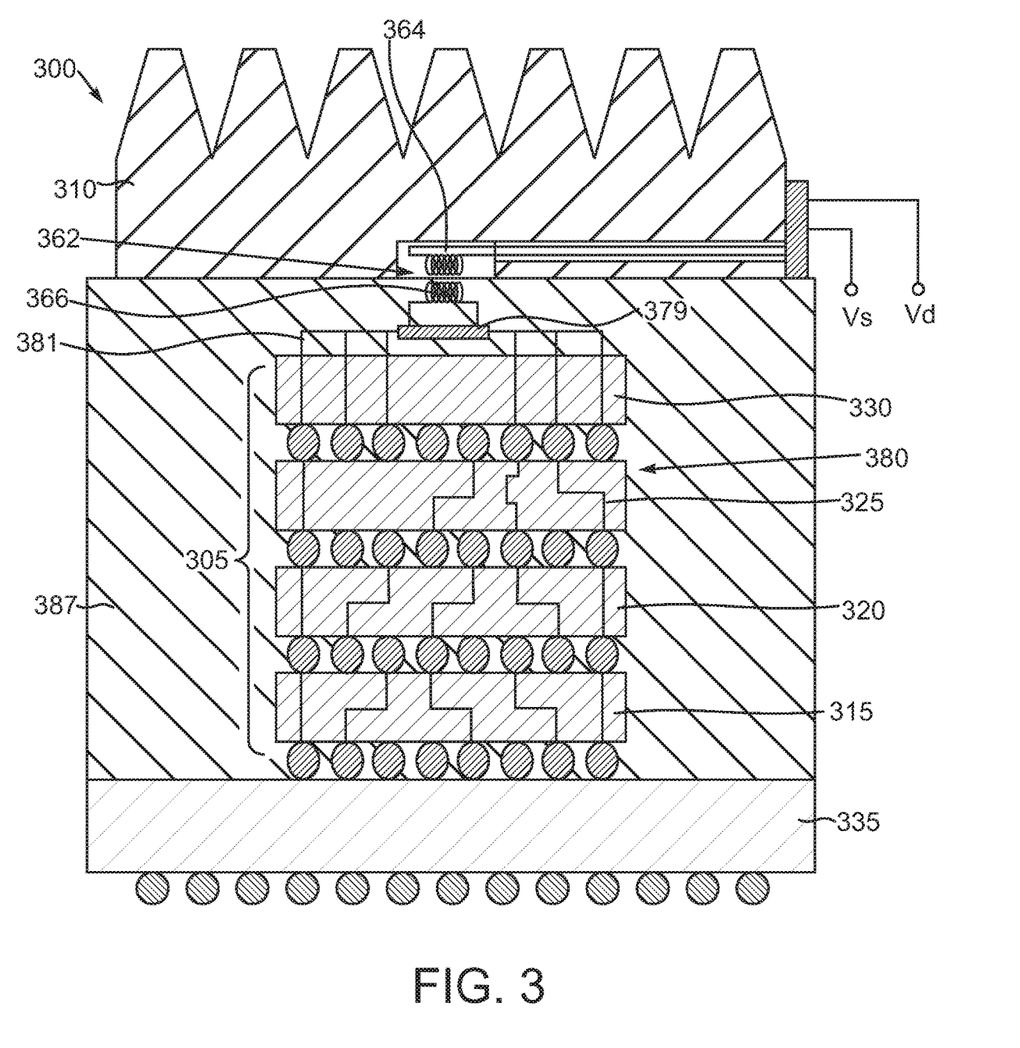
FIG. 3 is a sectional view of an alternate exemplary semiconductor chip device with a chip stack and molding.

In the arrangements depicted in FIGS. 1 and 2, the power receiving inductor coils 166 and 266 are positioned and otherwise part of the semiconductor chips 130 and 230. However, it should be understood that the receiving inductor coil can be positioned in other places and still obtain the benefit of the inductive power transfer described herein. One alternative arrangement of a semiconductor chip device 300 is depicted in FIG. 3, which is a sectional view like FIG. 1. Here a chip stack 305 is provided power by way of a heat spreader 310. The chip stack 305 and the heat spreader 310 can be configured like the other chip stacks 105 and 205 and heat spreaders 110 and 210 described elsewhere herein with a few exceptions. The chip stack 305 includes chips 315, 320, 325 and 330 positioned on a substrate 335. An inductive power transfer circuit 362 includes a transmitting inductor coil 364 and a receiving inductor coil 366 and voltage regulator 379, as well as the power delivery network 380 with the conductive pathways 381. However, the receiving inductor coil 366 and the voltage regulator 379 can be positioned over the semiconductor chip 330 but encased in a molding material 387 that encapsulates the chips 315, 320, 325 and 330 of the chip stack 305. As with the other arrangements, the voltage regulator 379 delivers regulated voltage to the chip stack 305 initially by way of the plural conductive pathways 381, but the pathways 381 are encased or at least partially encased in the molding material 387, and lead into the semiconductor chip 330. In other respects, the power and delivery network 380 can function like the network 140 described above in conjunction with FIG. 1. The provision of the molding material 387 facilitates the heat transfer between not only the chip stack 305 and the heat spreader 310 but also between the semiconductor chip 335 and the heat spreader 310 since the molding 387 provides a thermally conductive pathway up from the chip 335 to the heat spreader 310. The usage of a molding 387 also permits the usage of relatively larger structures for the inductor coil 366 than would otherwise perhaps be possible where the inductor coil 366 is implemented in an integrated circuit such as the chip 330. Well-known compression molding techniques and materials can be used to mold the molding material 387. In other arrangements, the inductor coil 364 could be positioned inside the molding material 387. The external power and ground connections to the coil 364 in these arrangements would have to be fashioned accordingly.

Figure 4:
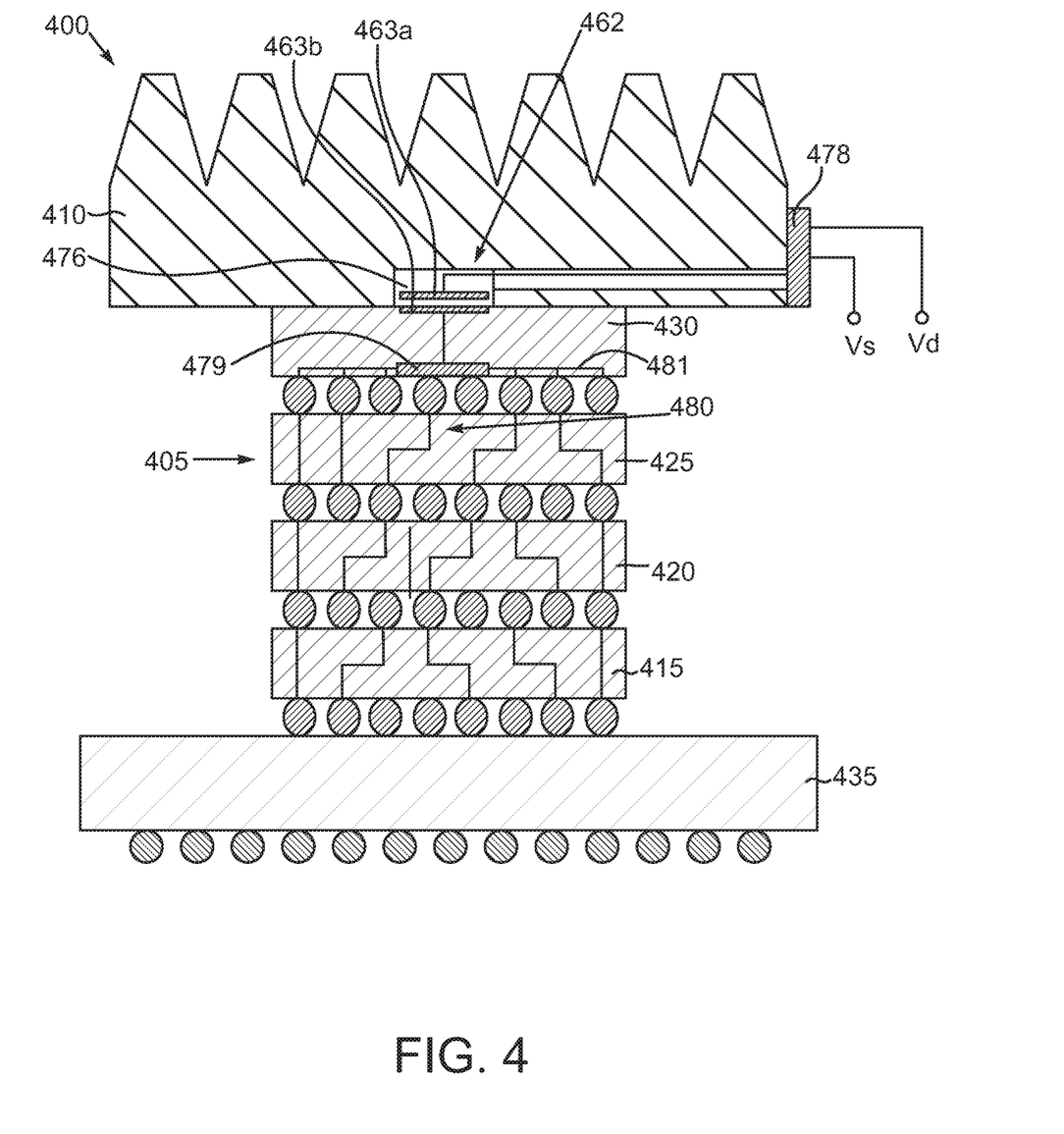
FIG. 4 is a sectional view of an alternate exemplary semiconductor chip device with a chip stack.

In lieu of inductive power transfer, the techniques described herein can be used to capacitively deliver power in the same general fashion between a heat spreader and a chip stack. An illustrative arrangement using capacitive power transfer will be described now in conjunction with FIG. 4, which is a sectional view like FIG. 1 but depicting an alternate exemplary semiconductor chip device 400. Here a chip stack 405 is provided power by way of a heat spreader 410. The chip stack 405 and the heat spreader 410 can be configured like the other chip stacks 105, 205 and 305 and heat spreaders 110, 210 and 310 described elsewhere herein with a few exceptions. The chip stack 405 includes chips 415, 420, 425 and 430 positioned on a substrate 435. A power transfer circuit 462 includes capacitor plates 463*a* and 463*b* to capacitively deliver power to the chip stack 405 by way of the heat spreader 410. The capacitor plate 463*a* is positioned in a pocket 476 in the heat spreader 410 and the capacitor plate is positioned in the semiconductor chip 430. A power supply logic 478 mounted on the heat spreader 410 is connected to the capacitor plate 463*a*. A voltage regulator 479 in the chip 430 is connected to the capacitor plate 463*b* and to a power delivery network 480 with the conductive pathways 481. In this illustrative arrangement, the power supply logic 478 similarly includes an AC source such that the top capacitor plate 463*a* charges and discharges according to the generated AC electric field. Note that the molding material 387 shown in FIG. 3 could be used for this arrangement and any of the other disclosed arrangements.

It should be understood that other methods of delivering power to a chip stack such as wire bonding can be used. In this regard, attention is now turned to FIG. 5, which is a sectional view like FIG. 1, but of an alternate exemplary semiconductor chip device 500. Here a chip stack 505 is provided with thermal management by way of a heat spreader 510. The chip stack 505 and the heat spreader 510 can be configured like the other chip stacks 105, 205, 305 and 405 and heat spreaders 110, 210, 310 and 410 described elsewhere herein with a few exceptions. The chip stack 505 includes chips 515, 520, 525 and 530 positioned on a substrate 535. The chip 530 includes a voltage regulator 579 and the stack 505 includes the power delivery network 580. However, this alternative chip stack 505 is supplied with power from the substrate 535 by way of bond wires 588 where it should be understood that the number of wires 588 can be much more than what is shown. The bond wires 588 connect from the substrate 535 up to bond pads 589 of the semiconductor chip 530. The bond pads are connected to the voltage regulator 579 by conductive pathways 590 in the chip 530. In this way, power is supplied from the substrate 535 to the semiconductor chip 530. The bond pads 589, and any disclosed alternatives, can be constructed of copper, aluminum, gold, silver or other conductors. Note that the alternate exemplary heat spreader 510 is seated on the semiconductor chip 530 but is provided with a pedestal 591 that is slightly smaller in footprint than the chip 530 to accommodate the bonding wires 588 and connections thereof to the bond pads 589.

Figure 5:
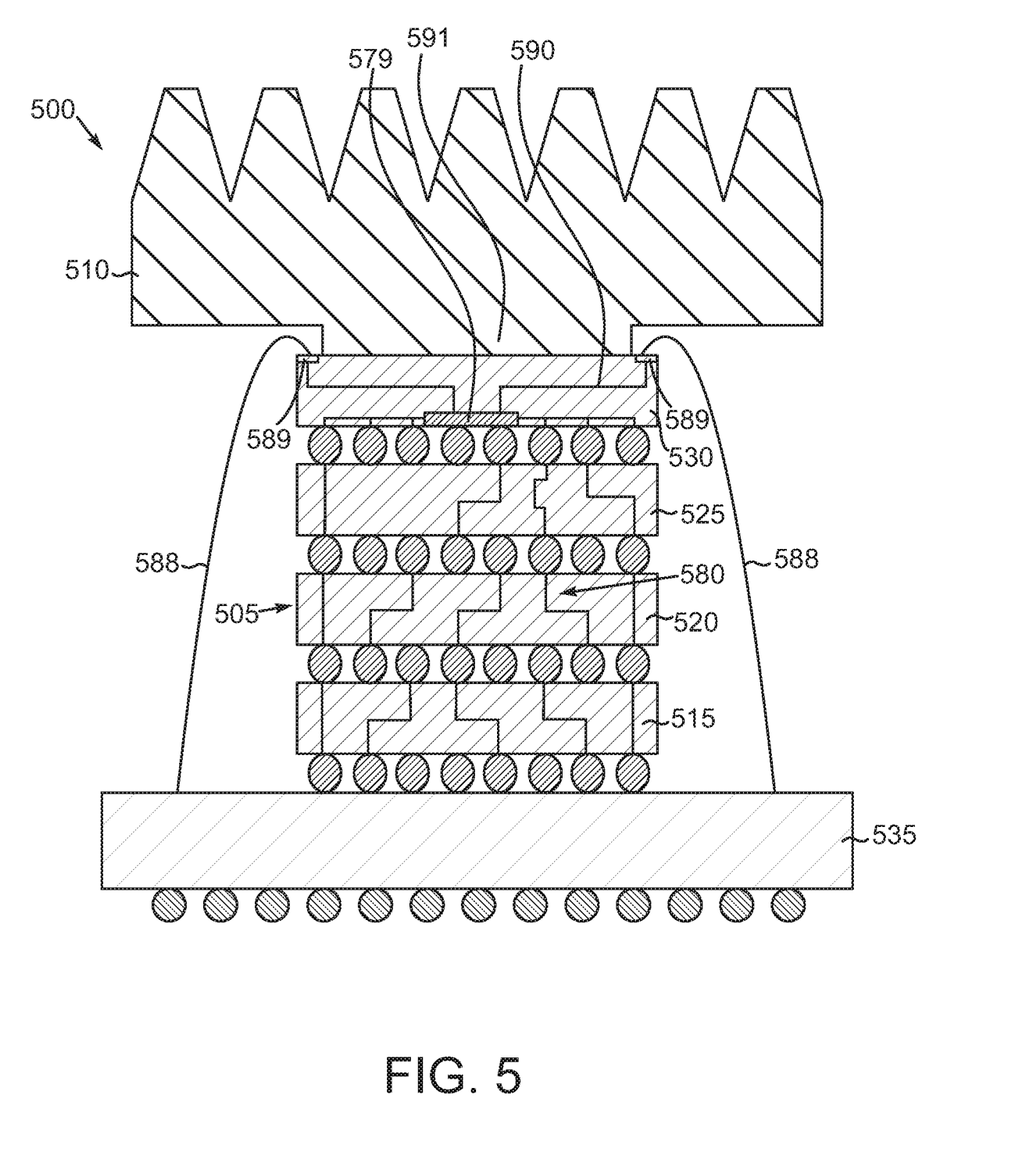
FIG. 5 is a sectional view of an alternate exemplary semiconductor chip device with a chip stack.
Figure 6:
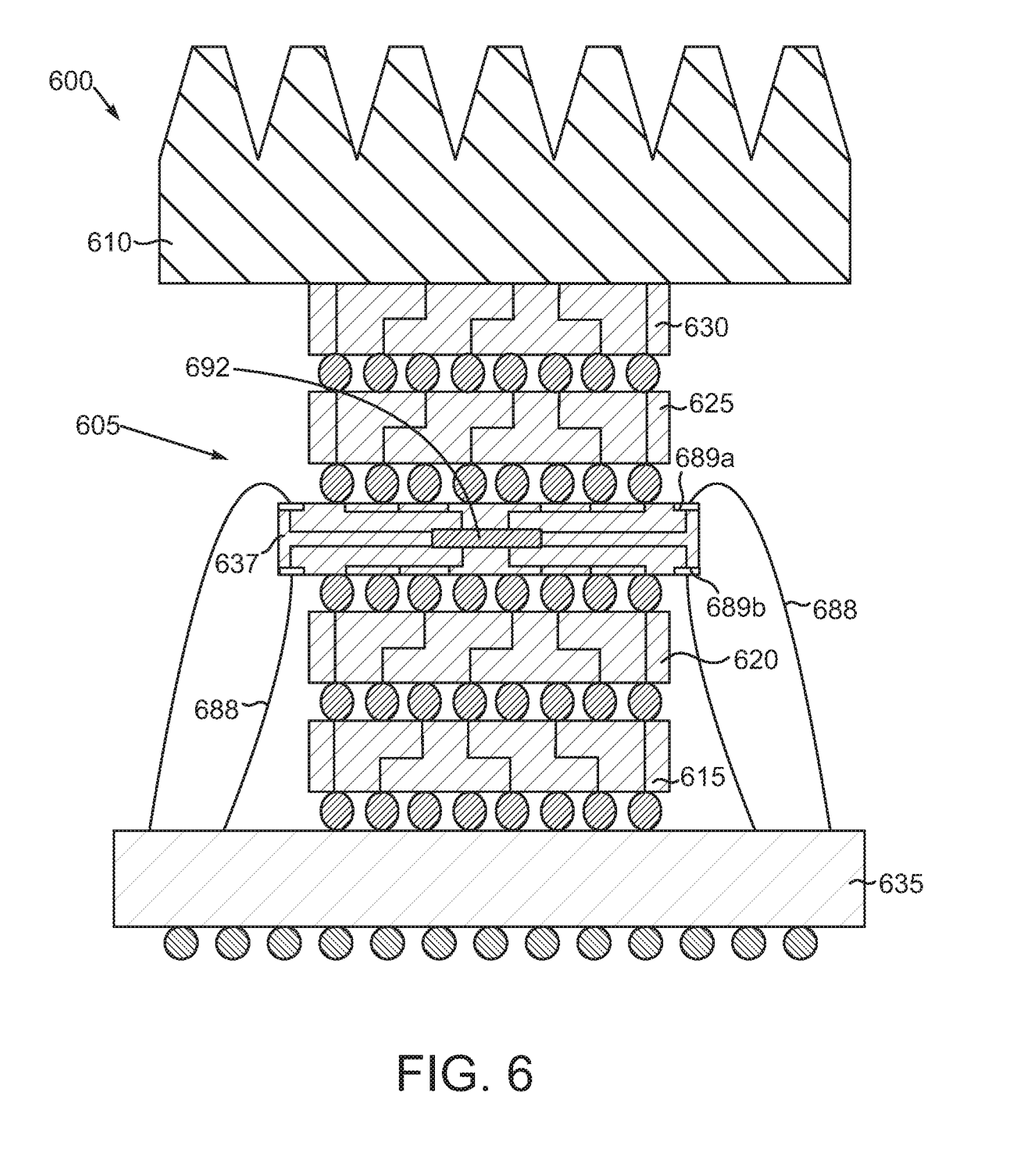
FIG. 6 is a sectional view of an alternate exemplary semiconductor chip device with a chip stack.

Bond wire power delivery can be provided in yet another arrangement depicted in FIG. 6, which is a sectional view like FIG. 5. Here, a chip stack 605 is provided with thermal management by way of a heat spreader 610. The chip stack 605 and the heat spreader 610 can be configured like the other chip stacks 105, 205, 305, 405 and 505 and heat spreaders 110, 210, 310, 410 and 510 described elsewhere herein with a few exceptions. The chip stack 505 includes chips 615, 620, 625 and 630 positioned on a substrate 635. However, an additional semiconductor chip 637 dedicated power delivery is interposed in the stack 605, and in this arrangement, between the chips 620 and 625. The semiconductor chip 637 can be configured to deliver power from bond wires 688 connected from the substrate 635 where it should be understood that the number of wires 688 can be much more than what is shown. To do this, the semiconductor chip 637 includes upper bond pads 689*a* that connect to some of the bonding wires 688 and lower bond pads 689*b* that are connected to others of the bonding wires 688. The bond pads 689*a* and 689*b* are connected to a voltage regulator 692 in the chip 637 that is operable to deliver regulated voltage to the chips 615, 620, 625 and 630. It should be understood that this arrangement has the advantage of symmetry and potentially smaller ohmic losses delivering voltage to the outer most chips 615 and 630. In other arrangements, the semiconductor chip 637 can be figured to deliver, and one or more of the semiconductor chips 615, 620, 625 and 630 can be configured to receive, electric power inductively or capacitively as disclosed elsewhere herein.

Figure 7:
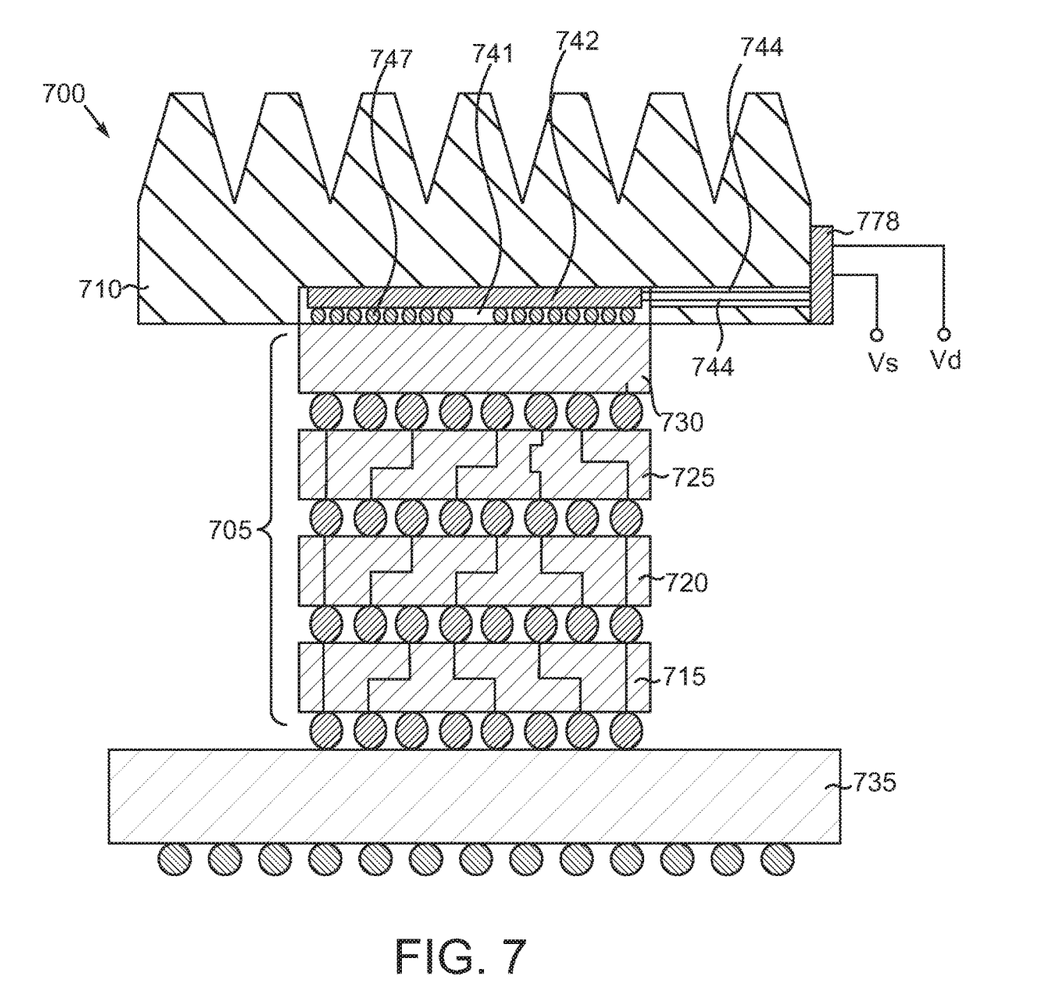
FIG. 7 is a sectional view of an alternate exemplary semiconductor chip device with a chip stack.

In an alternate exemplary arrangement, a heat spreader can be permanently and ohmically connected to the top most chip in a chip stack by way of plural solder connections or bumps. In this regard, attention is now turned to FIG. 7, which is a sectional view like FIG. 1, but of an alternate exemplary semiconductor chip device 700. Here, a chip stack 705 is provided with thermal management by way of a heat spreader 710. The chip stack 705 and the heat spreader 710 can be configured like the other chip stacks 105, 205, 305, 405 and 505 and heat spreaders 110, 210, 310, 410 and 510 described elsewhere herein with a few exceptions. The chip stack 705 includes chips 715, 720, 725 and 730 positioned on a substrate 735. However, the alternate exemplary heat spreader 720 includes a pocket 741 that is large enough to accommodate a power distribution semiconductor chip 742 that is connected by way of leads 744 and 746 to power supply logic 778 and external power and ground Vd and Vs. The topmost chip 730 includes plural solder connections or bumps 747 that are metallurgically bonded to the backside of the semiconductor chip 730 in the stack 705. In this way, the bumps 747 not only serve as ohmic connections but also heat conductive pathways from the chip up to the heat spreader 710. It may be desirable to fill the remainder of the pocket 741 with some type of thermally conducting paste to enhance the heat transfer from the chip 730 up to the heat spreader 710.

Figure 8:
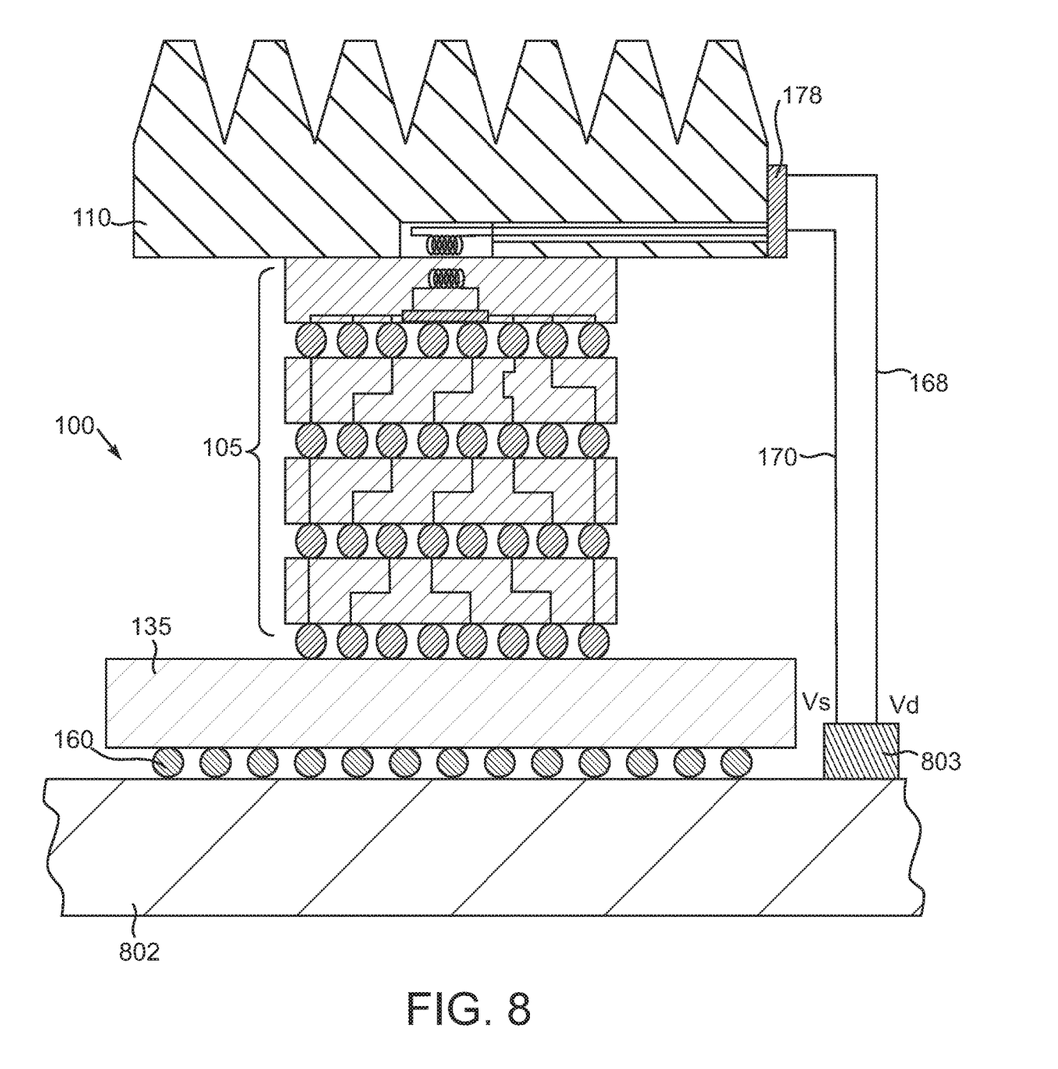
FIG. 8 is a sectional view of an alternate exemplary semiconductor chip device with a chip stack mounted on a circuit board.

Any of the disclosed arrangements, can be mounted on a circuit board. In this regard, attention is now turned to FIG.

8, which is a sectional view like FIG. 1 but depicting the semiconductor chip device 100, including the chip stack 105, mounted on an exemplary circuit board 802. The circuit board 802 can include a power supply/ground socket 803 that is connected to the leads 168 and 170, which are in turn connected to the power supply logic 178 of the heat spreader 110. The semiconductor chip 135 and the chip stack 105 thereon are mounted to the circuit board 802 and connected thereto by way of the interconnects 160. The circuit board 802 can be a system board, a circuit card, a daughter board or other type of circuit board.

A three-dimensional integrated circuit includes a first structure, the first structure including a first region that provides the means for transferring electric power from the first region to the at least one die structure, a second region that provides the means for transferring electric power to the first region, and first electrical contacts that are disposed in the second region along a periphery of the first structure. At least one die structure is in contact with the first structure.

The three-dimensional integrated circuit as described in the previous paragraph wherein the first structure is a heat spreader. The three-dimensional integrated circuit, as recited in the previous paragraph, wherein the means for transferring electric power from the first region to the at least one die structure includes an inductor coil coupled to the first structure and another inductor coil coupled to the at least one die structure. The three-dimensional integrated circuit as recited in the previous paragraph, wherein the at least one die structure is in contact with the first structure above it, and at least one die structure is in contact with the first structure below it. The three-dimensional integrated circuit as recited in the previous paragraph, wherein the first structure is the molding material disposed along the periphery of the at least one die structure.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
    a substrate;
    at least one semiconductor chip stacked on the substrate;
    a heat spreader stacked on the at least one semiconductor chip; and
    an inductor coil coupled to the heat spreader and another inductor coil coupled to the at least one semiconductor chip for transferring electric power from the heat spreader to the at least one semiconductor chip.

2. The apparatus of claim 1, wherein the substrate comprises a semiconductor chip.

3. The apparatus of claim 1, comprising a molding material at least partially encapsulating the at least one semiconductor chip.

4. The apparatus of claim 1, comprising a voltage regulator in the at least one semiconductor chip.

5. The apparatus of claim 1, comprising a power supply semiconductor chip coupled to the heat spreader and electrically connected to the at least one semiconductor chip.

6. An apparatus, comprising:
    a stack of semiconductor chips having an uppermost semiconductor chip and a lowermost semiconductor chip;
    a heat spreader positioned on the uppermost semiconductor chip; and
    a power transfer circuit configured to transfer electric power from the heat spreader to the uppermost semiconductor chip, the power transfer circuit including an inductor coil coupled to the heat spreader and another inductor coil coupled to the uppermost semiconductor chip.

7. The apparatus of claim 6, comprising a molding material at least partially encapsulating the stack of semiconductor chips.

8. The apparatus of claim 6, wherein the power transfer circuit comprises a voltage regulator in the uppermost semiconductor chip.

9. The apparatus of claim 6, wherein the power transfer circuit comprises a power supply semiconductor chip coupled to the heat spreader and electrically connected to the uppermost semiconductor chip.

10. The apparatus of claim 6, comprising a substrate, the lowermost semiconductor chip being mounted on the substrate.

11. A method of manufacturing, comprising:
    fabricating a stack of semiconductor chips having an uppermost semiconductor chip and a lowermost semiconductor chip;
    positioning a heat spreader on the uppermost semiconductor chip; and
    connecting a power transfer circuit to the heat spreader and the stack, the power transfer circuit including an inductor coil coupled to the heat spreader and another inductor coil coupled to the uppermost semiconductor chip and being configured to transfer electric power from the heat spreader to the stack.

12. The method of claim 11, comprising at least partially encapsulating the stack of semiconductor chips with a molding material.

13. The method of claim 11, wherein the power transfer circuit comprises a voltage regulator in the uppermost semiconductor chip.

14. The method of claim 11, wherein the power transfer circuit comprises a power supply semiconductor chip coupled to the heat spreader and electrically connected to the uppermost semiconductor chip.

15. An apparatus, comprising:
    a substrate;
    at least one semiconductor chip stacked on the substrate;
    a heat spreader stacked on the at least one semiconductor chip; and
    a capacitor plate coupled to the heat spreader and another capacitor plate coupled to the at least one semiconductor chip for transferring electric power from the heat spreader to the at least one semiconductor chip.

16. An apparatus, comprising:
    a stack of semiconductor chips having an uppermost semiconductor chip and a lowermost semiconductor chip;
    a heat spreader positioned on the uppermost semiconductor chip; and
    a power transfer circuit configured to transfer electric power from the heat spreader to the uppermost semiconductor chip, the power transfer circuit including a capacitor plate coupled to the heat spreader and another capacitor plate coupled to the uppermost semiconductor chip.

* * * * *